(12) United States Patent
Taguwa

(10) Patent No.: US 6,475,907 B1
(45) Date of Patent: Nov. 5, 2002

(54) SEMICONDUCTOR DEVICE HAVING A BARRIER METAL LAYER AND METHOD FOR MANUFACTURING THE SAME

(75) Inventor: Tetsuya Taguwa, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/551,783

(22) Filed: Apr. 18, 2000

(30) Foreign Application Priority Data

Apr. 20, 1999 (JP) .......................................... 11-112213

(51) Int. Cl.⁷ ..................... H01L 21/4763; H01L 21/44
(52) U.S. Cl. ...................... 438/648; 438/627; 438/637; 438/653; 438/656
(58) Field of Search ................... 438/636, 637, 438/638, 627, 672, 675, 659, 629, 618, 622, 620, 664, 653, 648, 656, 652, 635

(56) References Cited

U.S. PATENT DOCUMENTS

| | | | | |
|---|---|---|---|---|
| 5,773,636 A | * | 6/1998 | Derderian et al. | 438/672 |
| 5,972,178 A | * | 10/1999 | Narasimhan et al. | 204/192.17 |
| 6,033,983 A | * | 3/2000 | Lee et al. | 438/637 |
| 6,051,281 A | * | 4/2000 | Kobayashi et al. | 427/535 |
| 6,096,645 A | * | 8/2000 | Lo et al. | 438/680 |

FOREIGN PATENT DOCUMENTS

| | | | | |
|---|---|---|---|---|
| EP | 0545602 | * | 6/1993 | ......... H01L/21/285 |
| JP | 05129227 | * | 5/1993 | ........... H01L/21/28 |
| JP | 6-5599 | | 1/1994 | ....... H01L/21/3205 |
| JP | 6-140403 | | 5/1994 | ....... H01L/21/3205 |
| JP | 08130302 | * | 5/1996 | ........... H01L/29/43 |
| JP | 8-181212 | | 7/1996 | ......... H01L/21/768 |
| JP | 3-198329 | | 8/1998 | ........... H01L/21/28 |
| JP | 11-74226 | | 3/1999 | ......... H01L/21/285 |
| JP | 11330002 | * | 11/1999 | ......... H01L/21/316 |

* cited by examiner

Primary Examiner—Trung Dang
Assistant Examiner—Brook Kebede
(74) Attorney, Agent, or Firm—Hayes Soloway PC

(57) ABSTRACT

There is provided a method for manufacturing a semiconductor device having a barrier metal layer, including the steps of forming a titanium film as the barrier metal layer on a silicon oxide film, forming a titanium nitride film, and oxidizing a surface of this titanium nitride film, then the titanium nitride film is formed thereon. This titanium nitride film is formed as taking in oxygen from an underlying oxide film. Therefore, its crystal growth is inhibited and its barrier metal layer property is improved.

4 Claims, 6 Drawing Sheets

102; silicon oxide film
101; silicon substrate

103; photo-resist film
104; contact hole
102  101

105; titanium film
102
104
101

106; first titanium nitride film
105  104
102
101

202; silicon oxide film
201; silicon substrate

203; trench

204; first titanium nitride film

205; oxide film

206; second titanium nitride film

207; copper film

204; first titanium nitride film
207; copper film
206; second titanium nitride film 210; silicon oxide film
209
208

209; fourth titanium nitride film
208; third titanium nitride film

211; via hole
207
210

SEMICONDUCTOR DEVICE HAVING A BARRIER METAL LAYER AND METHOD FOR MANUFACTURING THE SAME

BACKGROUND OF THE INVENTION

1. Field of the Invention

The present invention relates to a semiconductor device having a barrier metal layer made of a refractory metal film and a method for manufacturing the same and, more particularly to, the semiconductor device having the barrier metal layer with a barrier property which is improved by inhibiting crystallization of the barrier metal layer and the method for manufacturing the same.

2. Description of the Related Art

With the increasing integration density of Large Scale Integrations (LSIs), contact holes need to be more and more finely patterned, thus increasing an aspect ratio, i.e. a value of a depth of the contact hole divided by its diameter. With this, a layer made of aluminum or other metal formed by a conventional sputtering method, which has rather poor step coverage, may cause an increase in contact resistance at a contact hole or, possibly, disconnection at it. Even if wiring is possible, moreover, there might occur such an electro-migration phenomenon that a current flow would cause migration of aluminum atoms, so that the wiring is liable to be disconnected, thus problematically lowering a reliability.

To solve this problem, such a method has been employed that metal having good step coverage is buried in the contact hole.

A typical one of such methods is a tungsten-plug method whereby a tungsten layer excellent in step coverage formed by a Chemical Vapor Deposition (CVD) method is buried in the contact hole. According to this tungsten-plug method, first a titanium film is formed in the contact hole by a sputtering method to reduce connection resistance (contact resistance) of the contact hole, then, a barrier metal film made of titanium nitride is formed in the contact hole by the sputtering method to enhance adherence between this titanium film and the tungsten layer as well as to prevent the tungsten layer from penetrating into a substrate, and then the tungsten layer is buried into the contact hole by the CVD method, and then the tungsten layer is etched back overall to be left only in the contact hole, thus forming a tungsten plug. With this method also, as the fine patterning of the contact hole advances and therefore its aspect ratio is increased, the sputtering method becomes unable to form the titanium film or titanium nitride film, i.e. barrier metal layer, to a desired thickness in the contact hole. This may lead to increase in contact resistance or destruction of circuit elements by the tungsten layer.

To guard against this, it has been attempted to form the titanium film and the titanium nitride film by the CVD method. This thermal-reaction CVD method is widely used because the titanium film nitride formed by such CVD method as utilizing thermal reaction is most excellent in step coverage. Note here that the contact hole is filled with the titanium film, the titanium nitride film, and a tungsten film, all three of which are formed by the CVD method.

First, as shown in FIG. 3A, on a silicon substrate 301 on which element-isolating regions are defined by field insulator films (not shown), a silicon oxide film 302 is formed as an inter-layer insulator film to a thickness of 1.5 $\mu$m by the CVD method.

Next, as shown in FIG. 3B, a photo-resist film 303 is formed on the silicon oxide film 302 and then patterned by typical photolithography so as to make an opening at positions where a contact hole 304 is to be formed. Using this photo-resist film 303 as a mask, dry etching is performed to form the contact hole 304 in this silicon film 302 which reaches the silicon substrate 301. This contact hole 304 has a diameter of approximately 0.4 $\mu$m.

Next, as shown in FIG. 3C, the photo-resist film 303 is removed and then a titanium film 305 is formed. Specifically, this titanium film 305 is formed to a thickness of 10 nm by the CVD method, whereby a plasma is generated by flowing a gas mixture containing 10 sccm (standard cubic centimeter per minute) of titanium tetra-chloride and 1000 sccm of argon (Ar), setting an intra-chamber pressure at 20 Torr and a wafer temperature at 500° C. or higher, and applying several hundreds of watts of high-frequency power between the opposing electrodes of the silicon substrate 301.

Next, as shown in FIG. 3D, a first titanium nitride film 306 is formed on the titanium film 305 to a thickness of 60 nm. Specifically, this first titanium nitride film 306 can be formed by flowing 50 sccm of titanium tetra-chloride, 100 sccm of ammonia, and 50 sccm of nitrogen, setting the intra-chamber pressure at 30 Torr, and heating a susceptor so that the wafer temperature would be 600° C.

Next, as shown in FIG. 3E, a tungsten film 307 is formed overall by the CVD method to fill the contact hole 304. In fact, the tungsten film 307 is formed in two steps of nucleation and hole filling. Specifically, after the semiconductor substrate 301 is heated to 450° C., a gas mixture is introduced which contains 10 sccm of mono-silane, 20 sccm of tungsten hexa-fluoride, 800 sccm of argon, and 1000 sccm of hydrogen and setting the intra-chamber pressure at 30 Torr by use of a pressure regulating valve to perform the tungsten film 307 formation for about 10 seconds.

After nucleation is thus performed on the silicon substrate 301, continuously a gas mixture is introduced which contains 95 sccm of tungsten hexa-fluoride, 600 sccm of argon, and 1000 sccm of hydrogen and setting the intra-chamber pressure at 90 Torr to perform the tungsten film 307 formation for about 50 seconds in order to fill the contact hole 304. Under these conditions, the tungsten film 307 is formed to a thickness of about 5000 Å on the silicon oxide film 302.

Next, as shown in FIG. 3F, part of the tungsten film 307 in the contact hole 304 being left as is, the other part of the tungsten film is etched back and removed by use of a gas containing sulfur hexa-fluoride, to expose the surface of the first titanium nitride film 306.

Next, as shown in FIG. 3G, an aluminum-alloy film 308 is deposited overall by the sputtering method and patterned into a desired wiring by photolithographic and dry etching methods, to complete an aluminum wiring.

According to the above-mentioned prior-art technologies, however, the first titanium nitride film 306 formed by the thermal CVD method is of a prismatic polycrystalline construction and so has a lot of grain boundaries with insufficient barrier nature. To improve the barrier property, it is effective to increase the thickness of the first titanium nitride film 306, which may destroy a diffused layer formed in the silicon substrate 301 surface and also may result in increase in the aspect ratio of the contact hole 304 into which tungsten plug 309 is to be buried. When the titanium nitride film 306 is formed by the CVD method, in particular, the titanium nitride film 306 titanium nitride film 306 is subject to larger stress, which may cause cracking in the first titanium nitride film 306 or its flaking-off, thus reducing manufacturing yield.

SUMMARY OF THE INVENTION

In view of the above, it is an object of the present invention to provide a semiconductor device having a barrier metal layer which can improve a barrier property and prevent lowering of manufacturing yield without destruction of diffused layers in a substrate surface nor deterioration of an aspect ratio of contact holes and a method for manufacturing a same.

According to a first aspect of the present invention, there is provided a semiconductor device having a barrier metal layer, including:

a semiconductor substrate;

an insulator film having a through hole therein formed on the semiconductor substrate;

a first refractory metal nitride film which is formed on an inside surface of the through hole in the insulator film and a surface of which is oxidized or in a surface of which oxygen is absorbed; and a second refractory metal nitride film which is formed on the first refractory metal nitride film and which has taken in oxygen.

In the foregoing, the preferable mode is one that wherein further includes a metal region buried in the through hole.

Also, according to a second aspect of the present invention, there is provided a semiconductor device having a barrier metal layer, including:

a semiconductor substrate;

an insulator film which is formed on the semiconductor substrate and which has a trench therein;

a first refractory metal nitride film which is formed on an inside surface of the trench in the insulator film and a surface of which is oxidized or into a surface of which oxygen is absorbed; and a second refractory metal nitride film which is formed on the first refractory metal nitride and which has taken in oxygen.

In the foregoing, the preferable mode is one that wherein further includes a metal region buried in the trench.

Also, the preferable mode is one that wherein further includes:

a third refractory metal nitride film which is formed on the insulator film and the metal region buried in the trench and a surface of which is oxidized or into a surface of which oxygen is absorbed;

a fourth refractory metal nitride film which is formed on the third refractory metal nitride film and has taken in oxygen; and an insulator film which is formed on the fourth refractory metal nitride film and which has an insulator film having a through hole therein at a position aligned with the metal region.

Also, according to a third aspect of the present invention, there is provided a method for manufacturing a semiconductor device having a barrier metal layer, including the steps of:

forming an insulator film on semiconductor substrate on which elements are formed;

selectively removing the insulator film at a predetermined region, to form a through hole at which a underlying conductive layer is exposed;

depositing a metal film;

depositing a first refractory metal film on the metal film;

oxidizing a surface of the first refractory metal nitride film or absorbing oxygen into the surface; and depositing a second refractory metal nitride film on the first refractory metal nitride film.

In the above third aspect, a preferable mode is one wherein the metal film is a refractory metal film, refractory metal alloy film, a refractory metal silicide film, refractory metal nitride film, low-resistance metal film or a like.

Also, the preferable mode is one wherein the first and the second refractory metal nitride films are titanium nitride films formed by a Chemical Vapor Deposition method (CVD).

Also, the preferable mode is one wherein the step of oxidizing a surface of the first refractory metal nitride film or absorbing oxygen into the surface is an oxygen-plasma irradiation method.

Furthermore, according to a fourth aspect of the present invention, there is provided a method for manufacturing a semiconductor device having a barrier metal layer, including the steps of:

forming an insulator film on a semiconductor substrate; selectively removing the insulator film at a predetermined position, to form a trench;

a depositing a first refractory metal film;

oxidizing a surface of the first refractory metal nitride film or absorbing oxygen into the surface; and depositing a second refractory metal nitride film on the first refractory metal nitride film.

In the above fourth aspect, the preferable mode is one that wherein further includes the steps of:

forming a metal film on the second refractory metal nitride film;

with only parts of the first and the second refractory metal nitride films and the metal film formed in the trench being left as are, removing other parts on the insulator film;

forming a third refractory metal nitride film a surface of which is oxidized overall or into a surface of which oxygen is absorbed;

forming a fourth refractory metal nitride film on the third refractory metal nitride film; and forming an insulator film having a through hole at a position which is aligned with the metal region, in the fourth refractory metal nitride film.

Also, the preferable mode is one wherein the first and the second refractory metal nitride films are titanium nitride films formed by a Chemical Vapor Deposition method.

Also, the preferable mode is one wherein the step of oxidizing a surface of the first refractory metal nitride film or absorbing oxygen into the surface is an oxygen-plasma irradiation method.

With the above configurations, after a titanium nitride film is formed, its surface is oxidized or oxygen is absorbed into it, then on it another titanium nitride film is formed. With this, the second titanium nitride film thus formed on the oxidized surface of the first titanium nitride film grows as taking in oxygen, so that its crystallization is inhibited, resulting in a remarkably small number of grain boundaries left. Thus, by the present invention, the titanium nitride film grows as taking in oxygen, hence in an amorphous manner, with a very small number of grain boundaries left. Therefore, atoms are inhibited from migrating through the grain boundaries, thereby improving the barrier property. Therefore, the barrier layer can be made thinner.

BRIEF DESCRIPTION OF THE DRAWINGS

The above and other objects, advantages and features of the present invention will be more apparent from a following description taken in conjunction with accompanying drawings in which.

DESCRIPTION OF THE PREFERRED EMBODIMENTS

A following will describe embodiments of the present invention with reference to the accompanying drawings.

First Embodiment

FIGS. 1A to 1G are cross-sectional views showing a step-wise method for manufacturing a semiconductor device according to a first embodiment of the present invention.

Figure 1A:
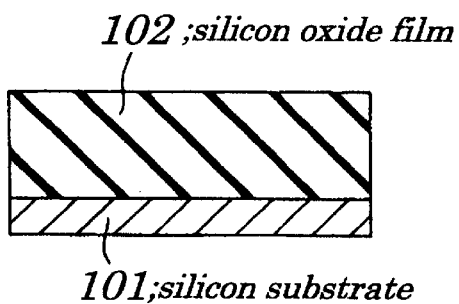
FIGS. 1A to 1G are cross-sectional views showing a step-wise method for manufacturing a semiconductor device according to a first embodiment of the present invention.

First, as shown in FIG. 1A, on a silicon substrate 101 having elements formed thereon a silicon oxide film 102 is formed to a thickness of, about 2.5 μm by a CVD method.

Figure 1B:
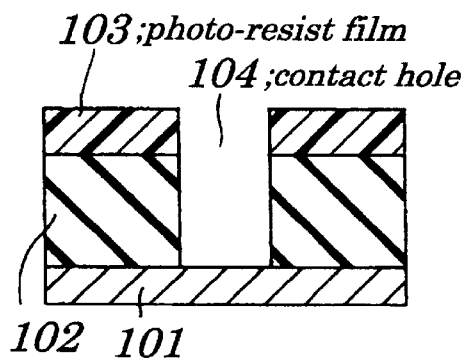

Next, as shown in FIG. 1B, after a photo-resist film 103 is applied, an opening having a diameter of, e.g., about 0.4 μm is provided at a desired position on the photo-resist film 103. Using this photo-resist film 103 as a mask, the silicon oxide film 102 is etched by dry etching by use of a gas mixture containing, tri-fluoro methane ($CHF_3$) and carbon monoxide (CO), until the silicon substrate 101 is exposed to form a contact hole 104.

Figure 1C:
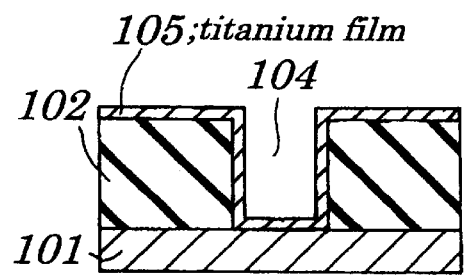

Next, as shown in FIG. 1C, after the photo-resist is removed, a titanium (Ti) film 105 is formed by the CVD method. Specifically, this titanium film 105 is formed to a thickness of about 10 nm by, for example, flowing a gas mixture containing 5–20 sccm of titanium tetra-chloride ($TiCl_4$) and 100–200 sccm of argon (Ar), setting a intra-chamber pressure at 1–20 Torr, heating a susceptor so that a wafer temperature would be 500° C. or higher, and applying several hundreds of watts of high-frequency power between the opposing electrodes of the silicon substrate 101, thus generating a plasma.

Figure 1D:
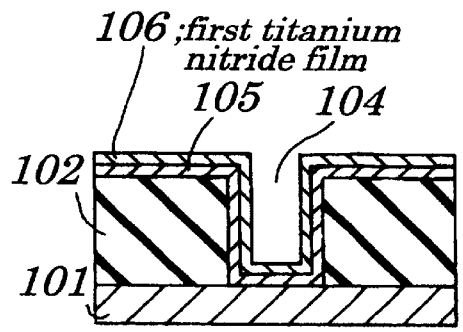

Next, as shown in FIG. 1D, a first titanium nitride film (TiN) film 106 is formed to a thickness of approximately 5 nm by the CVD method.

Specifically, this first titanium nitride film 106 can be formed by, for example, flowing a gas mixture containing 30–50 sccm of titanium tetra-chloride, 40–70 sccm of ammonia (NH3), and 30–50 sccm of nitrogen (N2), setting the intra-chamber pressure at 15–30 Torr, and heating the susceptor so that the wafer temperature would be 600° C. Note here that the higher the wafer temperature at which the first titanium nitrogen film 106 is formed, the better would be a step coverage.

Figure 1E:
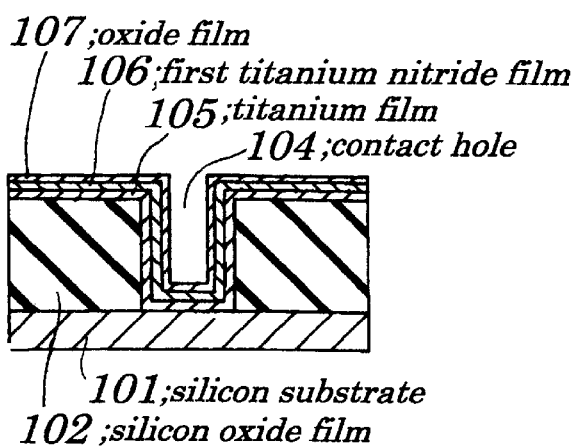

Next, as shown in FIG. 1E, the thus formed first titanium nitride film 106 is oxidized at its surface, to form an oxide film 107 thereon. Specifically, this oxide film 107 is formed by, for example, an oxygen plasma irradiation, method. Under such oxygen plasma conditions that for example a susceptor temperature is set at 80° C., the high-frequency power is set at 500 watts, 50 sccm of oxygen is flowed through the intra-chamber, and the pressure is set at 0.6 Torr, the first titanium nitride film 106 is irradiated with thus generated oxygen plasma for two minutes, to oxidize its surface. Note here that this oxide film 107 has the first titanium nitride film 106 into which a lot of oxygen atoms have penetrated, so that it may be sufficient that instead of forming this oxide film 107, the first titanium nitride film 106 would absorb oxygen atoms through its surface.

Figure 1G:
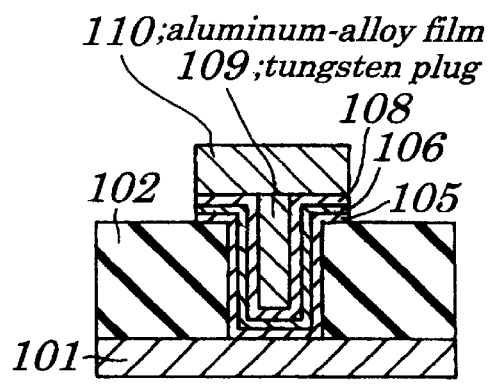
Figure 1F:
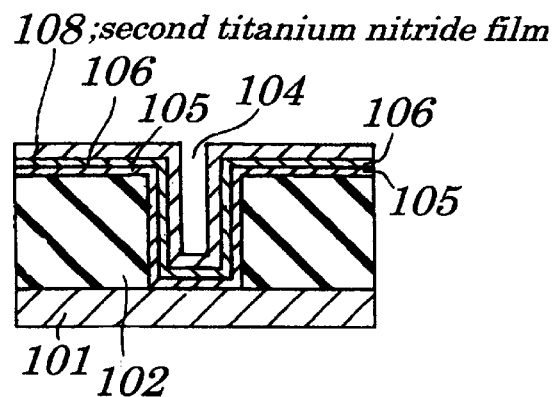

Next, as shown in FIG. 1G, a tungsten film (forming a tungsten plug 109) is formed by the CVD method. Specifically, this tungsten film is formed in two steps of nucleation and burying. That is, after the silicon substrate 101 is heated to 450° C., a gas mixture is introduced which contains 10 sccm of mono-silane, 20 sccm of tungsten hexa-fluoride, 800 sccm of argon, and 1000 sccm of hydrogen, setting the intra-chamber pressure at 30 Torr with a pressure regulation valve, to perform tungsten film formation for about 10 seconds. After nucleation is thus performed on the silicon substrate 101 surface, continuously a gas mixture is introduced which contains 95 sccm of tungsten hexa-fluoride, 600 sccm of argon, and 1000 sccm of hydrogen at the intra-chamber pressure set at 90 Torr with the pressure regulation valve to perform film formation for about 50 seconds, thus forming the tungsten film overall on the surface as filling the contact hole 104. When formed under such conditions, the tungsten film grows to about 5000 Å on the silicon oxide film 102.

The second titanium nitride film 108 itself, however, has conductivity to some extent, so that if it takes in too much oxygen, its specific resistance becomes too high, which enhances a wiring resistance and a contact resistance. Therefore, oxidation or absorption of oxygen in this case must be performed to such an extent that the specific resistance of the second titanium nitride film 108 would not be too high, because only a small amount of oxygen needs to be absorbed to inhibit crystallization.

Next, as shown in FIG. 1G, a tungsten film (forming a tungsten plug 109) is formed by the CVD method. Specifically, this tungsten film is formed in two steps of nucleation and burying. That is, after the silicon substrate 101 is heat to 450° C., a gas mixture is introduced which contains 10 sccm of mono-silane, 20 sccm of tungsten hexa-fluoride, 800 sccm of argon, and 1000 sccm of hydrogen, setting the intra-chamber pressure at 30 Torr with a pressure regulation valve, to perform tungsten film formation for about 10 seconds. After nucleation is thus performed on the silicon substrate 101 surface, continuously a gas mixture is introduced which contains 95 sccm of tungsten hexa-fluoride, 600 sccm of argon, and 1000 sccm of hydrogen at the intra-chamber pressure set at 90 Torr with the pressure regulation valve to perform film formation for about 50 seconds, thus forming the tungsten film overall on the surface as filling the contact hole 104. When formed under such conditions, the tungsten film grows to about 5000 Å on the silicon oxide film 102.

Afterward, with part of the tungsten film buried in the contact hole 104 being left as is, another part of the tungsten film on the silicon oxide film 102 is selectively etched with a gas containing sulfur hexa-fluoride to expose the second titanium nitride film 108. With this, the tungsten plug 109 is formed. Then, an aluminum-alloy film 110 is deposited overall on silicon oxide film 102, second titanium nitride film 108 and tungsten plug 109 by a sputtering method and subsequently processed into a desired pattern to complete an aluminum wiring.

Although in the present embodiment an oxygen plasma processing method is employed to oxidize the surface of the second titanium nitride film 108, various other methods may be used as far as they can oxidize that surface. Also, instead of oxidizing the surface of the first titanium nitride 106, oxygen may be absorbed in that surface by any desired absorption method.

By a semiconductor device-manufacturing method according to the first embodiment, after the first titanium nitride film 106 is formed, its surface is oxidized to obtain the oxide film 107, on which the second titanium nitride film 108 is formed. Thus, in the step of forming the second titanium nitride film 108, when growing on the oxidized surface, takes in oxygen, so that its crystallization is inhibited. With this, the atoms are prevented from migrating through the grain boundary, i.e. the barrier property is not deteriorated. Therefore, the barrier property is improved, thus enabling thinning of the barrier metal layer. Therefore, the barrier metal layer for the aluminum wiring over the contact hole 104 can be easily made thinner without increasing the number of steps required.

Second Embodiment

FIGS. 2A to 2J are cross-sectional views showing a step-wise method for manufacturing a semiconductor device according to a second embodiment of the present invention.

As shown in FIGS. 2, this embodiment relates to a case where the present invention is applied to a barrier metal layer for copper wiring. Copper has a problem in a respect that it very easily diffuses into a silicon oxide film widely used in a semiconductor device and so cannot directly be formed on a silicon oxide film.

Therefore, a barrier metal layer needs to be formed for preventing the diffusion of copper, between a copper film and the silicon oxide film.

Figure 2A:
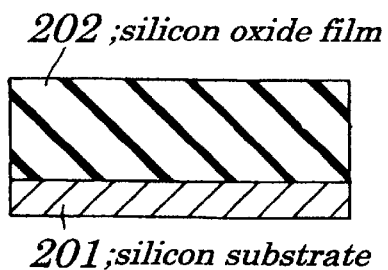
FIGS. 2A to 2J are cross-sectional views showing a step-wise method for manufacturing a semiconductor device according to a second embodiment of the present invention.

First, as shown in FIG. 2A, on a silicon substrate 201, a silicon oxide film 202 is formed to a thickness of 0.5–2.0 μm by a CVD method etc. as an inter-layer insulator film.

Figure 2B:
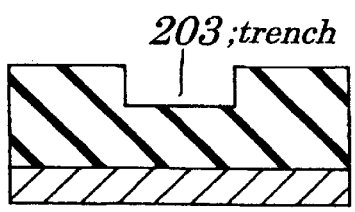

Next, as shown in FIG. 2B, on this silicon oxide film 202, a trench 203 is formed by a lithographic and dry-etching technologies. The trench 203 has a depth of 1200–4000 Å, measuring 4000–8000 Å from its bottom to the substrate 201.

Figure 2C:
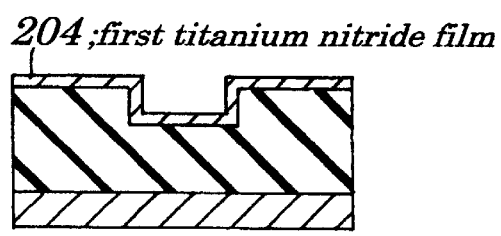

Next, as shown in FIG. 2C, a first titanium nitride film (TiN) 204 is formed to a thickness of 5 nm. Specifically, this first titanium nitride film 204 can be formed by flowing a gas mixture containing 30–50 sccm of titanium tetra-chloride, 40–70 sccm of ammonia (NH3), and 30–50 sccm of nitrogen (N2) at an intra-chamber pressure set at 15–30 Torr with a susceptor so heated that a wafer temperature would be 600° C.

Figure 2D:
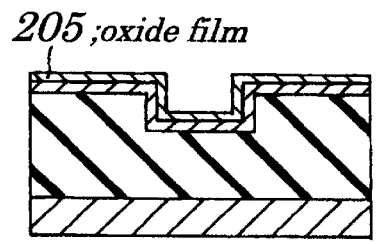

Next, as shown in FIG. 2D, the first titanium nitride film 204 is oxidized at its surface, to form an oxide film 205. It is actually oxidized by an oxygen plasma irradiation method. Under such conditions that, for example, a susceptor temperature is 80° C., a high-frequency power is 500 watts, oxygen is flowed at 50 sccm, and a pressure is 0.6 Torr, plasma is generated, with which the first titanium nitride film 204 is irradiated, to be oxidized at its surface.

Figure 2E:
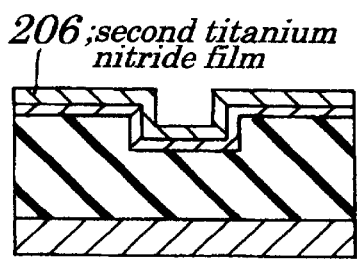

Next, as shown in FIG. 2E, a second titanium nitride film 206 is formed to a thickness of 15 nm. Conditions for this film formation are the same as those with the case of the first titanium nitride film 204. With this, this second titanium nitride film 206 grows as taking in oxygen contained in the surface of the oxide film 205 formed on the first titanium nitride film 204, thereby providing a second titanium nitride film 206 containing much oxygen.

Figure 2F:
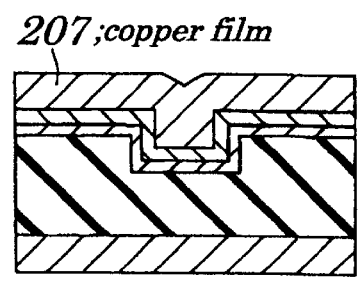

Next, as shown in FIG. 2F, a copper film 207 is formed until the trench 203 and barrier metal portions (the first titanium nitride film 204 and the second titanium nitride film 206) are all covered. Specifically, the copper film 207 is formed by a CVD, PVD, or electroplating method. After the copper film 207 formation, copper reflow processing is also performed.

Figure 2G:
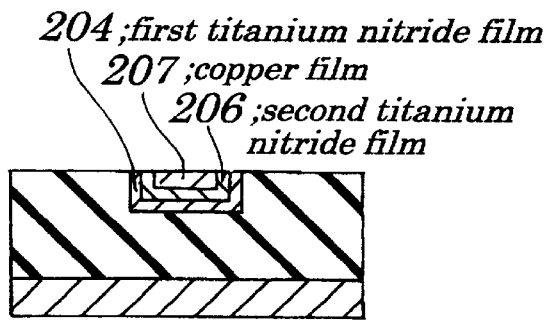

Next, as shown in FIG. 2G, the copper film 207 and the barrier metal on the silicon oxide film 202 are removed, to leave in the trench 203 only the copper film 207 and a first barrier metal, i.e. a combination of the first and second titanium nitride films 204 and 206. Although, in this case, the barrier metal on the silicon oxide film 202 can be typically removed by a Chemical Mechanical Polishing (CMP) method, it can be removed in much a same way by an etch-back method by use of a chlorine plasma, whereby the semiconductor substrate is heated to a high temperature.

Then, a second barrier metal layer is formed including the third titanium nitride film 208 and the fourth titanium nitride film 209. To form this second barrier metal layer, first a third titanium nitride film (TiN) 208 is formed overall on the surface to a thickness of 5 nm. The conditions for this film formation are the same as those with the first and second titanium nitride films 204 and 206. Subsequently, this third titanium nitride film 208 is oxidized at its surface. It may also be oxidized by an oxygen-plasma irradiation method. In this case, under such conditions that a susceptor temperature is 80° C., the high-frequency power is 500 watts, oxygen-gas flow rate is 50 sccm, and the pressure is 0.6 Torr, oxygen plasma is generated, with which the third titanium nitride film 208 is irradiated for two minutes, to be oxidized at its surface.

Figure 2I:
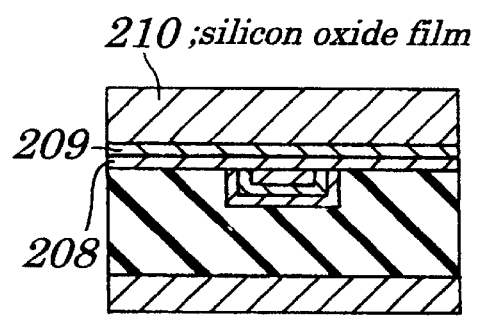
Figure 2H:
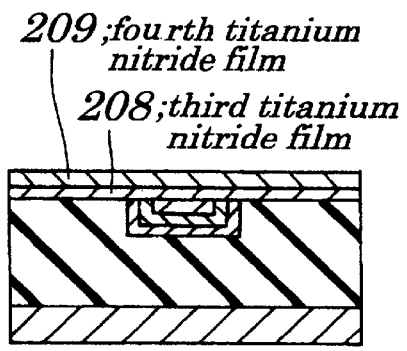
Figure 2J:
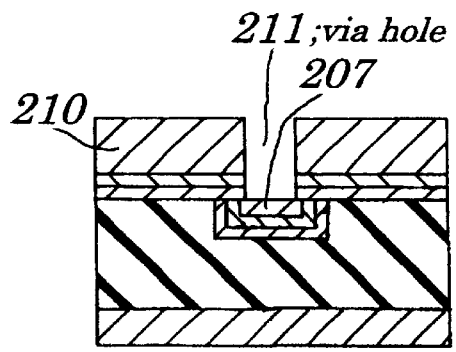
Figure 3A:
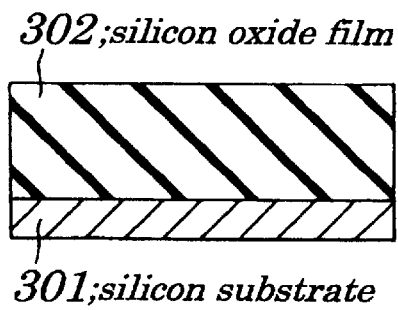
FIGS. 3A to 3G are cross-sectional views showing a step-wise method for manufacturing a semiconductor device by a conventional method.
Figure 3C:
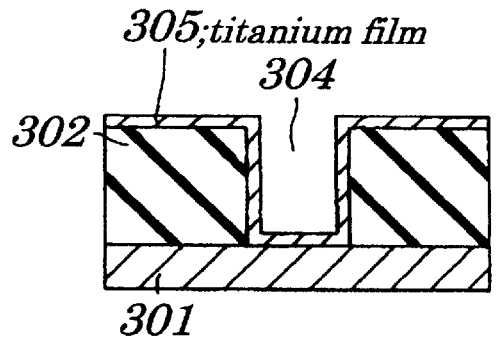
Figure 3B:
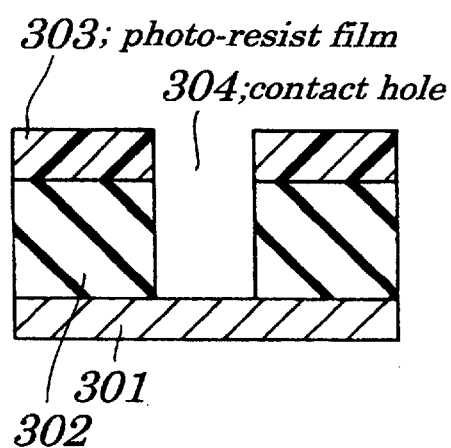
Figure 3D:
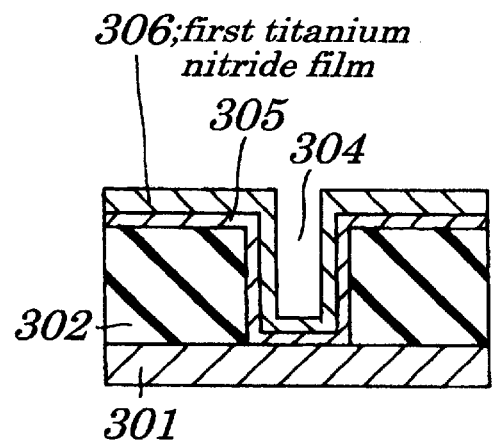
Figure 3E:
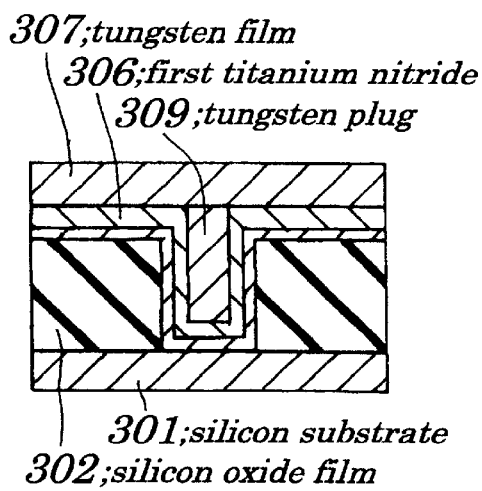
Figure 3G:
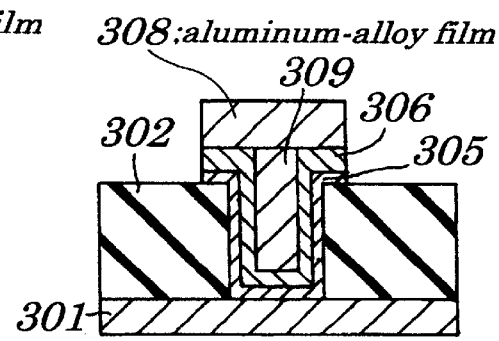
Figure 3F:
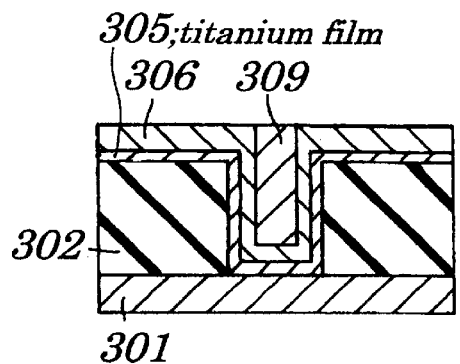

Next, as shown in FIG. 2H, a fourth titanium nitride film 209 is formed to a thickness of 150 nm. The conditions for forming this fourth titanium nitride film 209 are the same as those mentioned above. With this, the fourth titanium nitride film 209 grows as taking in oxygen contained in the oxide film formed on the surface of the third titanium nitride film 208. The fourth titanium nitride film 209 is thus formed containing much oxygen.

Next, as shown in FIG. 2I, on the second barrier metal layer, a silicon oxide film 210 is formed to a thickness of 0.5–2.0 μm by the CVD method or like, as an inter-layer insulator film. Then, in this silicon oxide film 210, a via hole 211 is formed by the photolithographic and dry-etching technologies which reaches an upper surface of a copper damascene electrode (copper film 207). After this via hole 211 is formed, electrodes and wiring are formed by a variety of methods.

Also by a method according to the above-mentioned embodiment, after one titanium nitride film is formed, it surface is oxidized and then on it, another titanium nitride film is formed. Therefore, the second titanium nitride film 206 formed on the first-titanium nitride film 204 grows as taking in oxygen contained in the first one, so that its crystallization is inhibited, thus resulting in reduction in the grain boundaries. Consequently, copper can be inhibited from being diffused, thus enabling thinning of the barrier metal layer.

As described above, according to the present invention, after the first refractory metal nitride film is formed, its surface is oxidized or oxygen is absorbed into it, and then on it the second refractory metal nitride film is formed, so that the second titanium nitride film 206 grows in an amorphous manner as taking in oxygen. With this, the second refractory metal nitride film can be inhibited from being crystallized, with a remarkably small number of grain boundaries left because refractory metal nitrides generally grows in the amorphous manner. As a result, the refractory metal nitride has improved the barrier property, thus enabling thinning of the barrier film. By the present invention, therefore, the barrier metal for aluminum wiring over the contact hole can be easily made thinner without increasing a number of steps required. Also, when the present invention is applied to the formation of a barrier layer made of a copper film, copper diffusion can be inhibited with a thinner version of the barrier metal layer (titanium nitride film), thereby exhibiting such an effect as having no cracking nor flaking-off in contrast to the conventional method with a thicker titanium nitride film as the barrier metal layer.

It is thus apparent that the present invention is not limited to the above embodiments but may be changed and modified without departing from the scope and spirit of the invention.

Finally, the present application claims the priority of Japanese Patent Application No. Hei 11-112213 filed on Apr. 20, 1999, which is herein incorporated by reference.

What is claimed is:

1. A method for manufacturing said semiconductor device having a barrier metal layer, comprising the steps of:

forming an insulator film on a semiconductor substrate;

selectively removing said insulator film at a predetermined position, to form a trench;

depositing a first refractory metal nitride film;

oxidizing a surface of said first refractory metal nitride film or absorbing oxygen into said surface;

depositing a second refractory metal nitride film on said first oxidized refractory metal nitride film;

forming a metal film on said second refractory metal nitride film;

with only metal regions of said first oxidized refractory metal and said refractory metal nitride films and said metal film formed in said trench being left as are, removing other metal regions on said insulator film;

forming a third refractory metal nitride film a surface of which is oxidized overall or into a surface of which oxygen is absorbed;

forming a fourth refractory metal nitride film on said third oxidized refractory metal nitride film; and forming an insulator film having a through hole at a position which is aligned with metal regions in said fourth refractory metal nitride film.

2. The method for manufacturing said semiconductor device having said barrier metal layer according to claim 1, wherein said first and said second refractory metal nitride films are titanium nitride films formed by a Chemical Vapor Deposition method.

3. The method for manufacturing said semiconductor device having said barrier metal layer according to claim 1, said step of oxidizing a surface of said first refractory metal nitride film or absorbing oxygen into said surface is an oxygen-plasma irradiation method.

4. The method for manufacturing said semiconductor device having said barrier metal layer according to claim 1, wherein said metal film is a refractory metal film, refractory metal alloy film, refractory metal silicide film, refractory metal nitride film, or low-resistance metal film.

* * * * *

UNITED STATES PATENT AND TRADEMARK OFFICE
CERTIFICATE OF CORRECTION

PATENT NO.    : 6,475,907 B1
DATED         : November 5, 2002
INVENTOR(S)   : Taguwa It is certified that error appears in the above-identified patent and that said Letters Patent is hereby corrected as shown below:

Column 1,
Line 1, "said" should be -- a --.

Column 2,
Line 2, "said refractory" should be -- said second refractory --.

Signed and Sealed this

Tenth Day of August, 2004

JON W. DUDAS
*Acting Director of the United States Patent and Trademark Office*